(12) United States Patent
Wang et al.

(10) Patent No.: US 12,198,913 B2
(45) Date of Patent: Jan. 14, 2025

(54) SEMICONDUCTOR PROCESS APPARATUS AND PROCESS CHAMBER

(71) Applicant: BEIJING NAURA MICROELECTRONICS EQUIPMENT CO., LTD., Beijing (CN)

(72) Inventors: Shiru Wang, Beijing (CN); Yujie Yang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 18/250,218

(22) PCT Filed: Oct. 21, 2021

(86) PCT No.: PCT/CN2021/125196
§ 371 (c)(1),
(2) Date: Apr. 23, 2023

(87) PCT Pub. No.: WO2022/083677
PCT Pub. Date: Apr. 28, 2022

(65) Prior Publication Data
US 2023/0411132 A1    Dec. 21, 2023

(30) Foreign Application Priority Data
Oct. 23, 2020    (CN) .......................... 202011144983.8

(51) Int. Cl.
*H01J 37/34*    (2006.01)
*C23C 14/35*    (2006.01)

(52) U.S. Cl.
CPC .......... *H01J 37/3452* (2013.01); *C23C 14/35* (2013.01); *H01J 37/3405* (2013.01); *H01J 2237/332* (2013.01)

(58) Field of Classification Search
CPC ............... H01J 37/3452; H01J 37/3266; H01J 37/32669; H01J 37/32715; H01J 37/3405;
(Continued)

(56) References Cited

U.S. PATENT DOCUMENTS

| 5,079,481 A | 1/1992 | Moslehi |
| 5,308,417 A | 5/1994 | Groechel |
| 6,249,200 B1 | 6/2001 | Stelter et al. |

FOREIGN PATENT DOCUMENTS

| CN | 104919082 A | 9/2015 |
| CN | 107313019 A | 11/2017 |

(Continued)

OTHER PUBLICATIONS

The World Intellectual Property Organization (WIPO) International Search Report for PCT/CN2021/125196 Jan. 20, 2022 6 Pages (including translation).

*Primary Examiner* — Rodney G McDonald
(74) *Attorney, Agent, or Firm* — ANOVA LAW GROUP, PLLC (57) ABSTRACT

A process chamber includes a chamber body, a base, and a magnetic conductive device. The base is arranged in the chamber body. The base includes a carrier surface configured to carry a wafer. The magnetic conductive device includes a magnet structure and a magnetic conductive structure made of a soft magnetic material. The magnet structure is arranged around the base and configured to provide a magnetic field above the base. The magnetic conductive structure is arranged under the carrier surface of the base, has a preset distance from the carrier surface of the base, and is configured to guide the distribution of the
(Continued)

magnetic field lines of the magnetic field above the base to cause the intensity of the magnetic field to be evenly distributed above the base and the directions of the magnetic field lines to be consistent at different positions of the corresponding carrier surface.

18 Claims, 8 Drawing Sheets

(58) Field of Classification Search
CPC .... H01J 2237/332; C23C 14/35; C23C 14/14; C23C 14/351; C23C 14/50; C23C 14/5806; C23C 14/54; C23C 14/56; H01F 7/0273; H01F 41/18; Y02P 70/50; H01L 21/67253
USPC .................................................. 204/298.16
See application file for complete search history.

(56) References Cited

FOREIGN PATENT DOCUMENTS

| | | | |
|---|---|---|---|
| CN | 108010718 | A | 5/2018 |
| CN | 207331049 | U | 5/2018 |
| CN | 112359335 | A | 2/2021 |
| JP | H0633232 | A | 2/1994 |
| JP | H08181074 | A | 7/1996 |
| JP | 2002190467 | A | 7/2002 |
| JP | 2005008917 | A | 1/2005 |
| JP | 2009141251 | A | 6/2009 |
| JP | 2013082993 | A | 5/2013 |
| JP | 2022525259 | A | 5/2022 |
| WO | 9953506 | A1 | 10/1999 |
| WO | 2018077090 | A1 | 5/2018 |
| WO | 2019011161 | A1 | 1/2019 |

SEMICONDUCTOR PROCESS APPARATUS AND PROCESS CHAMBER

CROSS-REFERENCE TO RELATED APPLICATIONS

This application is a national phase entry under 35 U.S.C. § 371 of International Application No. PCT/CN2021/125196, filed on Oct. 21, 2021, which claims priority to Chinese Application No. 202011144983.8 filed on Oct. 23, 2020, the entire contents of both of which are incorporated herein by reference.

TECHNICAL FIELD

The present disclosure generally relates to the semiconductor manufacturing technology field and, more particularly, to a semiconductor process apparatus and a process chamber.

BACKGROUND

Currently, an integrated circuit is a miniature electronic device or component. Transistors, resistors, capacitors, inductors, and other components and wiring required in a circuit are interconnected using a certain process. The integrated circuit is fabricated on one or several small semiconductor wafers or dielectric substrates and then packaged in a tube case to form a microstructure with a required circuit function. With the development of electronic devices in a direction of miniaturization, high frequency, integration, and functionalization, an electromagnetic compatibility problem of the components such as transistors, resistors, capacitors, and inductors interconnected by wiring becomes more and more serious. In a process of integrating electronic devices using a high-frequency microwave, an electromagnetic environment becomes more and more complex, and electromagnetic compatibility requirements of elements become higher and higher. Anti-electromagnetic interference has become a problem attracting attention.

Anti-electromagnetic interference electronic devices made of a special material in the existing technology has become an important direction for developing electromagnetic compatibility in the future. For example, by applying the high-frequency magnetic film on a side of the electronic devices and microwave circuits, a high-frequency noise signal can be effectively absorbed and inhibited. After continuous exploration and experiments, when a magnet is magnetized, an easy magnetization direction and a hard magnetization direction exist, because the magnet is magnetic anisotropy (i.e., all or some chemical or physical properties of a substance change as a direction changes and are different in different directions). In the easy magnetization direction, the anisotropy of a magnet crystal is small. In the hard magnetization direction, the anisotropy of the magnet crystal is large. The direction of the anisotropy field can affect the induction of the film to the electromagnetic field to affect the absorption effect of the film for the noise. Thus, it is important to fabricate high-frequency magnetic film with high magnetic anisotropy on a large scale.

In existing technology, magnetron sputtering technology is mainly used to fabricate the high-frequency magnetic film. During the preparation process, the wafer is arranged in a middle position of the magnetic group configured to generate an induced magnetic field. The magnetic group can form the induced magnetic field in a direction parallel to the film surface of the substrate to induce the easy magnetization direction of the magnetic film, and meanwhile, a buffer layer or different buffer layers are deposited on the substrate to increase the magnetic anisotropy. Then, an annealing process is performed on the magnetic film to maintain the magnetic anisotropy of the magnetic film well. For example, when NiFeCr/NiFe/Ta films are fabricated, the induced magnetic field generated by the magnet group is used to induce the easy magnetization direction of the nickel-iron (NiFe) film, and a tantalum (Ta) buffer layer and a nickel-iron-chromium (NiFeCr) buffer layer are deposited on the substrate. Then, the annealing processing is performed on the Ni81Fe19/tantalum (Ta) film with tantalum (Ta) buffer layer and the Ni81Fe19/tantalum (Ta) film with nickel-iron-chromium (NiFeCr) buffer layer. After the annealing processing at 350° C., the magnetic anisotropy of Ni81Fe19 films can be well maintained.

However, the intensity of the above-induced magnetic field is not sufficiently evenly distributed above the wafer, which causes the film deposited on the wafer to have poor magnetic anisotropy. Moreover, since the magnetic field lines of the induced magnetic field are in the arc shape above the wafer, the incident magnetic particles to the wafer have high speed and energy. Thus, crystal defects are generated in the film, the internal stress of the film is increased, and the crystallization quality of the film is poor.

SUMMARY

For the existing disadvantage, the present disclosure provides a semiconductor process apparatus and a process chamber configured to solve the technical problem that the quality and the magnetic anisotropy of the film are poor in the existing technology.

On one aspect, the present disclosure provides a process chamber of a semiconductor process apparatus, including a chamber body, a base, and a magnetic conductive device.

The base is arranged in the chamber body, and the base includes a carrier surface configured to carry a wafer.

The magnetic conductive device includes a magnet structure and a magnetic conductive structure made of a soft magnetic material. The magnet structure is arranged around the base and configured to provide a magnetic field above the base. The magnetic conductive structure is arranged under the carrier surface of the base, has a preset distance from the carrier surface of the base, and is configured to guide distribution of magnetic field lines of the magnetic field above the base to cause intensity of the magnetic field to be evenly distributed above the base and directions of the magnetic field lines to be consistent at different positions of the carrier surface.

In some embodiments, the magnetic conductive structure includes a magnetic conductive assembly. The magnetic conductive assembly includes a plurality of first magnetic conductive bars. The plurality of first magnetic conductive bars are distributed evenly in a circular area that is parallel to and opposite to the carrier surface. The plurality of first magnetic conductive bars extend along a first direction parallel to the carrier surface.

In some other embodiments, the magnetic conductive assembly includes a plurality of second magnetic conductive bars and a plurality of magnetic conductive rings. The plurality of second magnetic conductive bars are distributed in the circular area and extend different radial directions of the circular area. The plurality of second magnetic conductive bars is symmetrically distributed about the center of the circular area. The plurality of magnetic conductive rings are arranged in the circular area and overlap with the plurality of second magnetic conductive bars. The centers of the plurality of magnetic conductive rings coincide with the center of the circular area. Inner diameters of the plurality of magnetic conductive rings are different. The plurality of magnetic conductive rings are arranged at the same interval along a radial direction of the circular area.

In some other embodiments, the magnetic conductive assembly includes a magnetic conductive plate. The magnetic conductive plate is arranged parallel to and oppositely to the carrier surface.

In some embodiments, a distance between any two neighboring first magnetic conductive bars of the first magnetic conductive bars is greater than or equal to 4 mm and smaller than or equal to 8 mm.

In some embodiments, a ratio of a diameter of the circular area to a diameter of the carrier surface is greater than or equal to two thirds and smaller than or equal to one.

In some embodiments, the magnetic conductive structure further includes a fixing ring, an inner side of the fixing ring forms the circular area, and the fixing ring is connected to the magnetic conductive assembly and configured to fix the magnetic conductive assembly in the base.

In some embodiments, the magnet structure includes two groups of magnet groups and a fixing bracket. The fixing bracket is configured to fix the two groups of magnet groups around the base.

The two groups of magnet groups are arranged on two sides of the base along a radial direction of the carrier surface. Each group of magnet groups includes a plurality of magnet columns. The plurality of magnet columns are arranged in an arc shape along the circumference of the carrier surface at intervals. N poles and S poles of all magnet columns of the two groups of magnet groups are arranged along a second direction at a same height. The second direction is parallel to the radial direction of the base and has a preset angle with the first direction. N poles of magnet columns of one group of magnet groups are close to the base. S poles of magnet columns of the other group of magnet groups are close to the base.

In some embodiments, the preset angle is 90°.

In some embodiments, the outer surface of a magnet column is covered with an anti-corrosion layer made of a soft magnetic material.

In some embodiments, a thickness of the magnetic conductive structure is greater than or equal to 2 mm and smaller than or equal to 10 mm, and the preset distance is greater than or equal to 2 mm and smaller than or equal to 5 mm.

On a second aspect, embodiments of the present disclosure provide a semiconductor process apparatus, including the process chamber of the semiconductor process apparatus of the first aspect.

The beneficial technical effects brought by the technical solutions of embodiments of the present disclosure are as follows.

In embodiments of the present disclosure, the magnetic conductive structure is arranged under the carrier surface of the base. The magnetic conductive structure is configured to guide the distribution of the magnetic field lines of the magnetic field generated by the magnet structure above the base. That is, the magnetic conductive structure can have the magnetic yoke function to constrain the magnetic field lines. Thus, the intensity of the magnetic field can be evenly distributed above the base, and the directions of the magnetic field lines can be consistent at different positions of the corresponding carrier surface. Thus, hard and easy axes of the film can be consistent at different positions of the wafer to significantly improve the magnetic anisotropy of the film, reduce the incident energy of the magnetic particles, reduce the crystal defects of the film caused by the high-energy magnetic particles, and reduce the internal stress of the film. Thus, the crystallization quality of the film is improved. In addition, since the above magnetic conductive structure can significantly improve the magnetic anisotropy of the film, the buffer layer and the annealing process of the existing technology are not needed to improve the magnetic anisotropy of the film. Thus, the crystal defects of the film can be effectively reduced to improve the quality of the film.

Additional aspects and advantages of the present disclosure are partially described and become apparent through the following description or through the implementation of the present disclosure.

BRIEF DESCRIPTION OF THE DRAWINGS

The above and/or additional aspects and advantages of the present disclosure become apparent and easy to understand from the following description of embodiments in connection with the accompanying drawings.

DETAILED DESCRIPTION OF THE EMBODIMENTS

The present disclosure is described in detail below. Examples of embodiments of the present disclosure are illustrated in the accompanying drawings. The same or similar reference numerals refer to the same or similar members or members having the same or similar functions throughout. In addition, a detailed description of known technology is omitted if the detailed description of the known technology is not necessary for illustrating features of the present disclosure. Embodiments described below with reference to the accompanying drawings are exemplary and are only used to explain the present disclosure, but are not to be considered to limit the present disclosure.

Those skilled in the art can understand that, unless otherwise defined, all terms (including technical and scientific terms) used here have the same meaning as commonly understood by those of ordinary skill in the art to which the present disclosure belongs. It should also be understood that terms, such as those defined in a general dictionary, should be understood to have meanings consistent with meanings in the context of the existing technology. Unless specifically defined here, the terms should not be interpreted with idealistic or overly formal meanings.

The technical solutions of the present disclosure and how the above technical problems are solved in the technical solutions of the present disclosure are described in detail below with specific embodiments.

Figure 1:
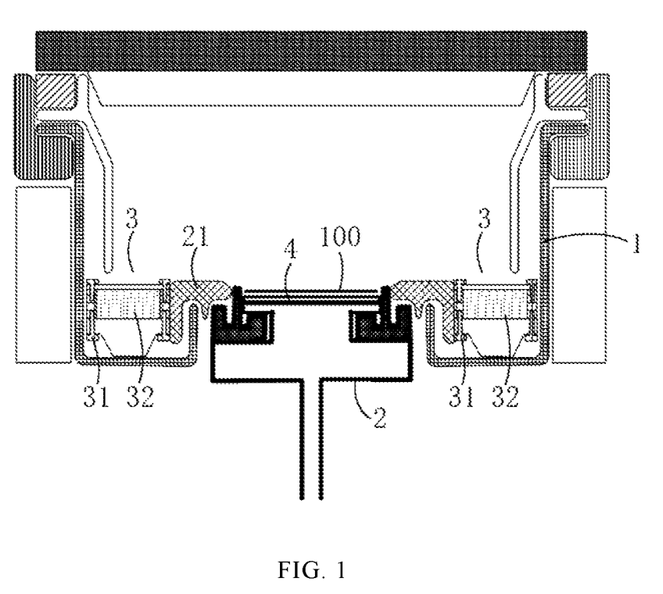
FIG. 1 illustrates a schematic cross-section structural diagram of a process chamber according to some embodiments of the present disclosure.

FIG. 1 illustrates a schematic cross-section structural diagram of a process chamber according to some embodiments of the present disclosure. As shown in FIG. 1, embodiments of the present disclosure provide the process chamber of a semiconductor process apparatus. The process chamber includes chamber body 1, a base 2, and a magnetic conductive device. Base 2 is arranged in chamber body 1. Base 2 includes a carrier surface configured to carry a wafer 100. The magnetic conductive device includes a magnet structure 3 and a magnetic conductive structure 4 made of a soft magnetic material. The soft magnetic material is a scientific term, which refers to a material that is easily magnetized and demagnetized. The magnet structure 3 is arranged around base 2 and configured to provide a magnetic field above the base 2. The magnetic conductive structure 4 is arranged under the carrier surface of the base 2, has a preset distance from the carrier surface of the base 2, and is configured to guide the distribution of the magnetic field lines of the magnetic field above the base 2. Thus, the intensity of the magnetic field above base 2 is uniformly distributed, and directions of the magnetic field lines at different positions of the corresponding carrier surface are consistent.

Since the magnetic conductive structure 4 is made of a soft magnetic material, the soft magnetic material does not have an excessive influence on the magnetic field compared to a hard magnetic material. Thus, the magnetic conductive structure 4 can be ensured to properly guide the magnetic field line distribution of the magnetic field above the base 2 by ensuring that the magnetic structure 3 can normally guide the magnetic field, which avoids the excessive influence on the magnetic structure 3 to cause failure in guiding the magnetic field. Meanwhile, since the soft magnetic material does not have an N pole and an S pole, the directions of the magnetic field lines generated by the soft magnetic material may not be formed in an arc shape. Thus, the soft magnetic material can guide the magnetic field lines of the magnetic field above the base 2 to be parallel with the surface of the wafer.

As shown in FIG. 1, the process chamber is specifically configured to perform a magnetron sputtering process or other processes, such as a physical vapor deposition or chemical deposition process. However, embodiments of the present disclosure are not limited to this. Specifically, base 2 is arranged in the chamber body 1, for example, at a middle position near the bottom. The base 2 is configured to carry the wafer 100.

In the magnetic conductive device, the magnet structure 3 can be made of NdFeB material. However, embodiments of the present disclosure are not limited to this, as long as the magnet structure 3 is made of a hard magnetic material. Magnet structure 3 can be arranged around the base 2 and configured to provide a magnetic field above the base 2. The magnetic field can be used as an inducing magnetic field to induce an easy magnetization direction of a magnetic film.

The magnetic conductive structure 4 can be made of a permalloy to form a sheet-shaped structure. However, embodiments of the present disclosure are not limited to this, as long as the magnetic conductive structure 4 is made of a soft magnetic material with magnetic permeability. The magnetic conductive structure 4 can be arranged below the carrier surface of the base 2, can have a preset distance from the carrier surface of the base 2, and can be configured to guide the magnetic field line distribution of the magnetic field above the base 2 to cause the intensity of the magnetic field to be distributed uniformly and the magnetic field lines to be consistent above the base 2. The above preset distance can be set according to the magnetic field line distribution of the magnetic field above the base 2, as long as the intensity of the magnetic field above the base 2 can be uniformly distributed and the directions of the magnetic field lines at different positions of the corresponding carrier surface can be consistent.

In some optional embodiments, to facilitate the installation and fixation of the magnetic conductive structure 4, the above magnetic conductive structure 4 can be arranged inside the base 2.

Figure 10:
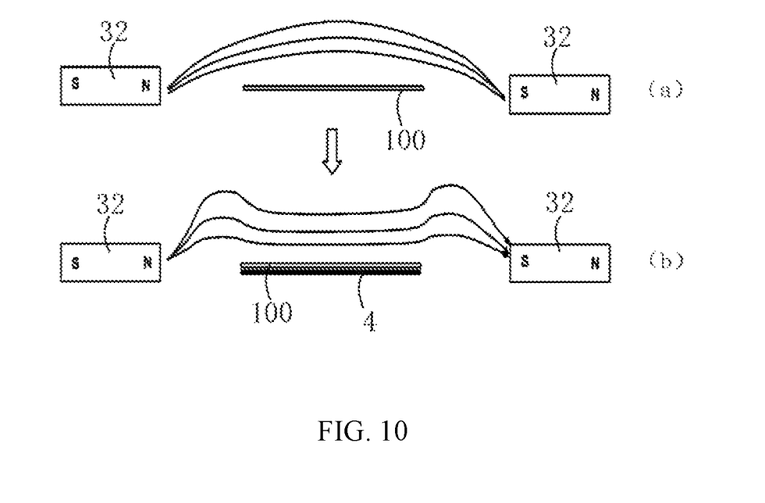
FIG. 10 illustrates a schematic diagram showing magnetic field line distributions of a magnetic field above a wafer when a magnetic conductive structure is not arranged under the wafer and the magnetic conductive structure is arranged under the wafer according to embodiments of the present disclosure.

The above magnetic conductive structure 4 can have a magnet yoke function to constrain the magnetic field lines. Thus, the magnetic field line distribution of the magnetic field generated by magnet structure 3 can be changed above the base. As shown in FIG. 10(a), when the magnetic conductive structure 4 is not arranged under wafer 100, the magnetic field lines from the N pole to the S pole of the magnet column 32 are in an arc shape. The magnetic field directions at different positions of the corresponding carrier surface of the base 2 in the radial direction can be normal directions of the arc at different positions. Thus, the directions of the magnetic field lines at different positions of the corresponding carrier surface can be different. Moreover, the distribution of the magnetic field intensity cannot be uniform at different positions of the corresponding carrier surface of the base 2. Specifically, the magnetic field intensity at a center area of the corresponding carrier surface of the base 2 can be smaller than the magnetic field intensity at an edge area of the corresponding carrier surface of the base 2.

In a process of depositing magnetic particles on the surface of wafer 100, due to the uneven distribution of the magnetic field intensity above the wafer 100, magnetic anisotropy of a film deposited on the wafer 100 can be poor. Moreover, since the directions of the magnetic field lines at different positions of the corresponding carrier surface are different, a speed and energy of a magnetic particle incident to the wafer 100 can be relatively high, which causes a crystal defect in the film to increase internal stress of the film. Thus, crystallization quality of the film can be poor.

As shown in FIG. 10(b), the magnetic conductive structure 4 is arranged under wafer 100. The magnetic conductive structure 4 can effectively guide the magnetic field line distribution of the magnetic field above the base to cause the directions of the magnetic field lines above the wafer 100 to be consistent. As shown in FIG. 10(b), the directions of the magnetic field lines above the wafer 100 tend to be parallel to the surface of the wafer 100. Thus, the magnetic particles deposited at different positions of the wafer 100 can be subjected to magnetic forces in the same horizontal direction to cause the magnetic particles to generate a certain amount of lateral movement. Thus, the speed of the magnetic particles vertically incident to the wafer 100 can be greatly weakened to reduce the incident energy of the magnetic particles, reduce the crystal defects caused by the high-energy magnetic particles to the film, reduce the internal stress of the film, and improve the crystallization quality of the film. Meanwhile, the magnetic conductive structure 4 can also make the magnetic field lines above the wafer 100 evenly distributed. Thus, the magnetic field intensity above the base can be evenly distributed, which causes hard and easy axes of the film to be consistent at the positions of the wafer to significantly improve the magnetic anisotropy of the film.

In embodiments of the present disclosure, the magnetic conductive structure is arranged under the carrier surface of the base. The magnetic conductive structure can be configured to guide the distribution of the magnetic field lines of the magnetic field generated by the magnet structure above the base. That is, the magnetic conductive structure can have a magnetic yoke function to constrain the magnetic field lines. Thus, the intensity of the magnetic field above the base can be uniformly distributed, and the directions of the magnetic field lines can be consistent at different positions of the corresponding carrier surface. Therefore, the hard and easy axes can be consistent at the positions of the wafer to significantly improve the magnetic anisotropy of the film. In addition, the incident energy of the magnetic particles can be reduced, the crystal defects caused by the high-energy magnetic particles in the film can be reduced, the internal stress of the film can be reduced, and the crystallization quality of the film can be improved. In addition, since the above magnetic conductive structure can significantly improve the magnetic anisotropy of the film, a buffer layer and an annealing process of the existing technology may not need to be used to improve the magnetic anisotropy of the film. Thus, the crystal defects of the film can be effectively reduced, and the film quality can be improved.

Figure 2:
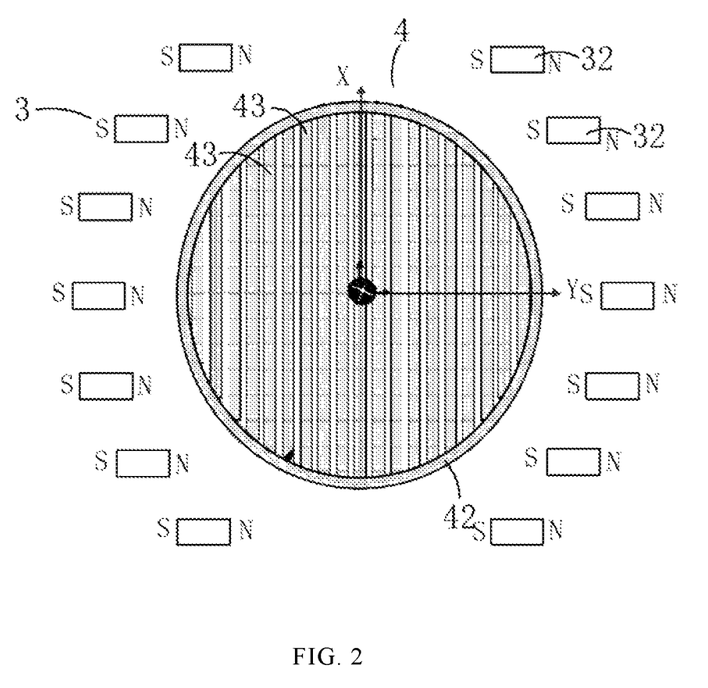
FIG. 2 illustrates a schematic top view of a magnetic conductive structure and a magnet structure according to some embodiments of the present disclosure.

In an embodiment of the present disclosure, as shown in FIG. 2, the above magnetic conductive structure 4 includes a magnetic conductive assembly. The magnetic conductive assembly includes a plurality of first magnetic conductive bars 43. The plurality of first magnetic conductive bars 43 can be evenly distributed in a circular area parallel to and opposite to the carrier surface of the base 2. The circular area, for example, can be arranged concentrically with the carrier surface. The plurality of first magnetic conductive bars 43 can be extended and arranged along a first direction parallel to the carrier surface (i.e., direction X in FIG. 2). For example, as shown in FIG. 2, lengths of the plurality of first magnetic conductive bars 43 in direction X are different from each other. An orthographic projection contour of the plurality of first magnetic conductive bars 43 on the carrier surface can be circular to ensure that the plurality of first magnetic conductive bars 43 are evenly distributed in the above circular area. Thus, the intensity of the magnetic field above the base can be evenly distributed and the directions of the magnetic field lines can be consistent at different positions of the corresponding carrier surface. In some embodiments, a distance between any two adjacent first magnetic conductive bars 43 can be greater than or equal to 4 mm and less than or equal to 8 mm, for example, 4 mm, 5 mm, 6 mm, 7 mm, or 8 mm. By setting the distance within this range, the magnetic field lines can be ensured to be sufficiently restrained, and meanwhile, the intensity of the magnetic field above the base can be evenly distributed, and the directions of the magnetic field lines can be consistent at different positions of the corresponding carrier surface. Of course, embodiments of the present disclosure are not limited to this, and those skilled in the art can adjust the settings by themselves according to different process requirements.

In an embodiment of the present disclosure, as shown in FIG. 2, the magnetic conductive structure 4 further includes a fixing ring 42. An inner side of the fixing ring 42 can be configured to define the above circular area. The fixing ring 42 can be connected to the above magnetic conductive assembly and configured to fix the magnetic conductive assembly in base 2. Specifically, the plurality of first magnetic conductive bars 43 are arranged on the inner side of the fixing ring 42. Two ends of each first magnetic conductive bar 43 can be fixedly connected to the fixing ring 42. The fixed connection can include, for example, an adhesive connection, a bolt connection, or welding. In addition, the fixing ring 42 can be arranged in base 2 in a detachable manner such as a bolt connection to facilitate assembly and replacement of the fixing ring 42. Of course, in practical applications, the above fixing ring 42 may not be arranged, and the magnetic conductive assembly can be fixed in the base 2 in any other manner.

In an embodiment of the present disclosure, the fixing ring 42 can also be made of a soft magnetic material. For example, the fixing ring 42 and the first magnetic conductive bars 43 can be made of the same soft magnetic material to achieve a better magnetic conductive effect.

Figure 5:
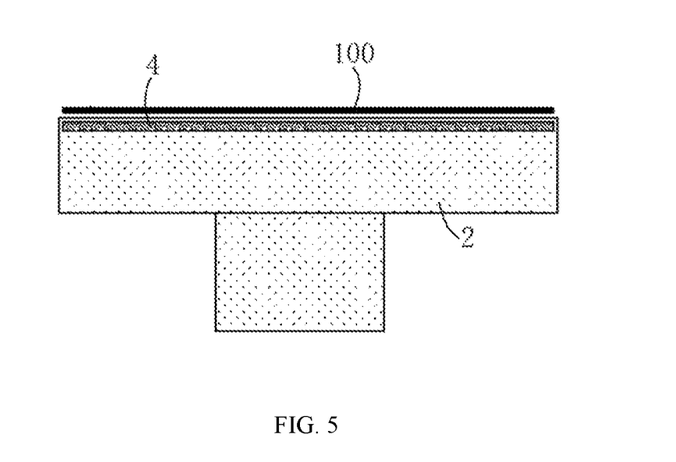
FIG. 5 illustrates a schematic cross-section structural diagram of a base according to some embodiments of the present disclosure.

In an embodiment of the present disclosure, a diameter of the circular area can be smaller than a diameter of the carrier surface of the base 2. For example, a ratio of the diameter of the circular area to the diameter of the carrier surface of the base 2 can be greater than or equal to two-thirds and less than or equal to one. By setting the diameter of the circular area within this range, the overall dimension of the magnetic conductive structure 4 can be optimized by ensuring that the intensity of the magnetic field is evenly distributed above the base, and the directions of the magnetic field lines are consistent at different positions of the corresponding carrier surface. Thus, the installation of the magnetic conductive structure 4 can be facilitated. Of course, in practical application, according to specific needs, for example, as shown in FIG. 5, the diameter of the circular area is the same as the diameter of the carrier surface of base 2.

It should be noted that, if the fixing ring 42 is also made of soft magnetic material, the diameter of the outer ring of the fixing ring 42 can be smaller than or equal to the diameter of the carrier surface of the base 2.

In an embodiment of the present disclosure, the thickness of the magnetic conductive structure 4 can be greater than or equal to 2 mm and less than or equal to 10 mm. The preset distance can be greater than or equal to 2 mm and less than or equal to 5 mm. However, embodiments of the present disclosure are not limited to this. Those skilled in the art can adjust the settings by themselves according to different process requirements.

In an embodiment of the present disclosure, as shown in FIG. 1 and FIG. 2, the magnet structure 3 includes two groups of magnet groups and a fixing bracket 31. The fixing bracket 31 can be configured to fix the two groups of magnet groups around base 2. As shown in FIG. 2, The two groups of magnet groups are arranged oppositely on two sides of base 2 (for example, left and right sides in FIG. 2) along the radial direction of the carrier surface of the base 2. Each group of magnet group can include a plurality of magnet columns 32. The plurality of magnet columns 32 can be arranged in an arc shape along a circumferential direction of the above carrier surface. N poles and the S poles of all the magnet columns 32 in the two groups of magnet groups are arranged at a same height along a second direction (i.e., direction Y in FIG. 2). The second direction can be parallel to the radial direction of the base 2 and form a preset angle with the first direction (i.e., direction X in FIG. 2). The preset angle in FIG. 2 is 90°. Of course, in practical applications, the above preset angle can be greater than or equal to 0° and less than or equal to 90°, for example, 0°, 10°, 30°, 50°, 60°, or 80°. Moreover, the N poles of all the magnet columns 32 in one group of magnet groups (i.e., the magnet group on the left side in FIG. 2) can be close to the base 2, and S poles of all the magnet columns 32 in the other group of magnet groups (i.e., the magnet group on the right side in FIG. 2) can be close to the base 2.

By extending and arranging the plurality of first magnetic conductive bars 43 along the first direction parallel to the above carrier surface (i.e., direction X in FIG. 2) and having a preset angle with the second direction, embodiments of the present disclosure can be meet different process requirements to greatly improve the applicability and scope of application. Moreover, with the above design of the magnetic conductive structure 4, embodiments of the present disclosure can have a simple structure and be easy to be implemented, and the application and maintenance costs can be effectively reduced and maintained.

By fixing the two groups of magnetic groups in the chamber body 1 through the fixing bracket 31 and arranging the two groups of magnetic groups around the base 2, on one hand, the space on the upper surface of the base 2 can be greatly saved, which causes embodiments of the present disclosure to be suitable for a large size wafer, for example, a 12-inch wafer. On another hand, since the magnet columns 32 have a certain distance from the base 2, which avoids the problem that the magnetic property of the magnet column is degraded due to the temperature change of the base in the existing technology. Thus, the service life of the magnet structure 3 can be greatly increased, and the distribution of the magnet columns 32 can also be helpful to improve the uniformity of the film.

In some other embodiments of the present disclosure, by changing the density of the distribution of the magnet columns 32, the purpose of adjusting the intensity of the magnetic field and the magnetic field distribution can be achieved near the wafer. Thus, the magnetic anisotropy of the film can be adjusted.

In an embodiment of the present disclosure, an upper end of the magnet column 32 can be flush with the upper surface of the wafer 100 arranged on the carrier surface. Thus, the magnetic field lines can be ensured to be distributed near the top of the wafer 100.

In an embodiment of the present disclosure, the magnet column 32 can be a cylinder, a cuboid, etc.

In an embodiment of the present disclosure, the fixing bracket 31 can be made of a metal material or a non-metal material, as long as the fixing bracket 31 is corrosion-resistant and does not affect the magnetic property of the magnet column 32. Specifically, the fixing bracket 31 can be arranged between a side wall of the chamber body 1 and a cover ring 21 of the base 2.

In an embodiment of the present disclosure, two fixing brackets 31 can be provided. The two fixing brackets 31 can be arranged on two opposite sides of base 2 and configured to fix the two groups of magnet groups, respectively. However, embodiments of the present disclosure are not limited to this.

It should be noted that embodiments of the present disclosure do not necessarily include the fixing bracket 31. The magnet columns 32 can also be arranged in chamber body 1 in another manner. For example, the magnet columns 32 can be directly bonded to the bottom wall of chamber body 1. Embodiments of the present disclosure are not limited to this, and those skilled in the art can adjust the settings by themselves according to the actual situation.

It should be noted that embodiments of the present disclosure do not limit the magnetic conductive structure 4 to have a split structure. For example, the magnetic conductive structure 4 can also be formed integrally. Embodiments of the present disclosure are not limited to this, and those skilled in the art can adjust the settings according to the actual situation.

In an embodiment of the present disclosure, the magnetic conductive structure 4 can include a plurality of through-holes (not shown in the figure) corresponding to support thimbles of the base 2. The inner diameters of the through-holes can be larger than the outer diameters of the support thimbles for the thimbles to pass through, which avoids mechanical interference of the base 2 during ascending and descending processes of the support thimbles and transferring the wafer to effectively reduce a failure rate of embodiments of the present disclosure.

Figure 3:
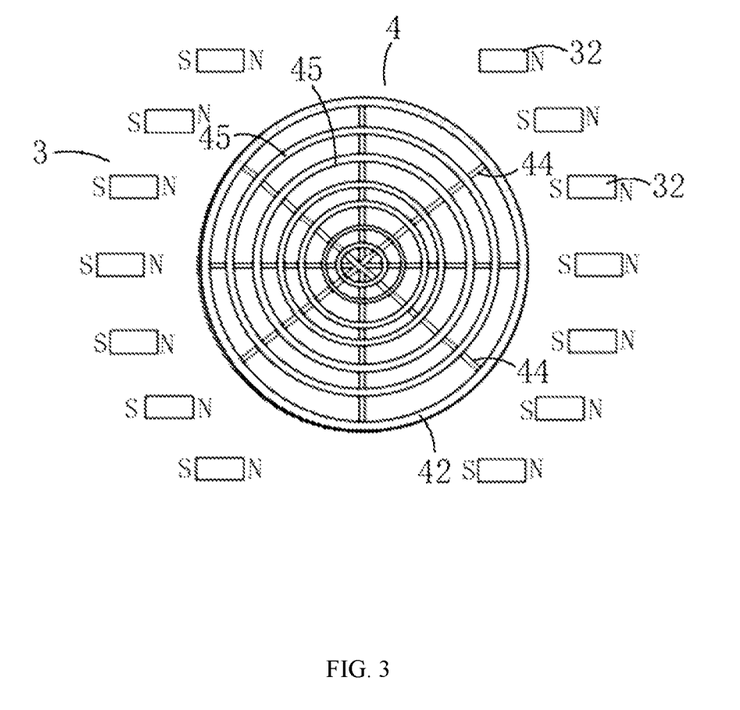
FIG. 3 illustrates a schematic top view of another magnetic conductive structure and another magnet structure according to some embodiments of the present disclosure.

In another embodiment of the present disclosure, as shown in FIG. 3, the magnetic conductive assembly further includes a plurality of second magnetic conductive bars 44 and a plurality of magnetic conductive rings 45. The plurality of second magnetic conductive bars 44 are distributed in a circular area parallel to and opposite to the carrier surface of the base 2 and extend along different radial directions of the circular area. The plurality of second magnetic conductive bars 44 can be symmetrically arranged to the center of the above circular area. The plurality of magnetic conductive rings 45 can be arranged in the above circular area and overlap with the plurality of second magnetic conductive bars 44. Centers of the plurality of magnetic conductive rings 45 can coincide with the center of the above circular area. The plurality of magnetic conductive rings 45 can have different inner diameters and be arranged along the radial direction of the above circular area at an equal interval. For example, FIG. 3 shows four second magnetic conductive bars 44. The four second magnetic conductive bars 44 can extend along different radial directions of the circular area to form a structure similar to a "*" shape. With the above design, the distribution of the magnetic field lines can be guided above base 2. Thus, the intensity of the magnetic field can be evenly distributed above the base 2, and the directions of the magnetic field lines can be consistent. Since the design of the structure is simple and appropriate, the application cost and the maintenance cost can be greatly reduced. In embodiments of the present disclosure, fixing ring 42 can be also provided. The structure and function of the fixing ring 42 can be the same as the structure and function of the fixing ring 42 in FIG. 2, which is not repeated here.

Figure 4:
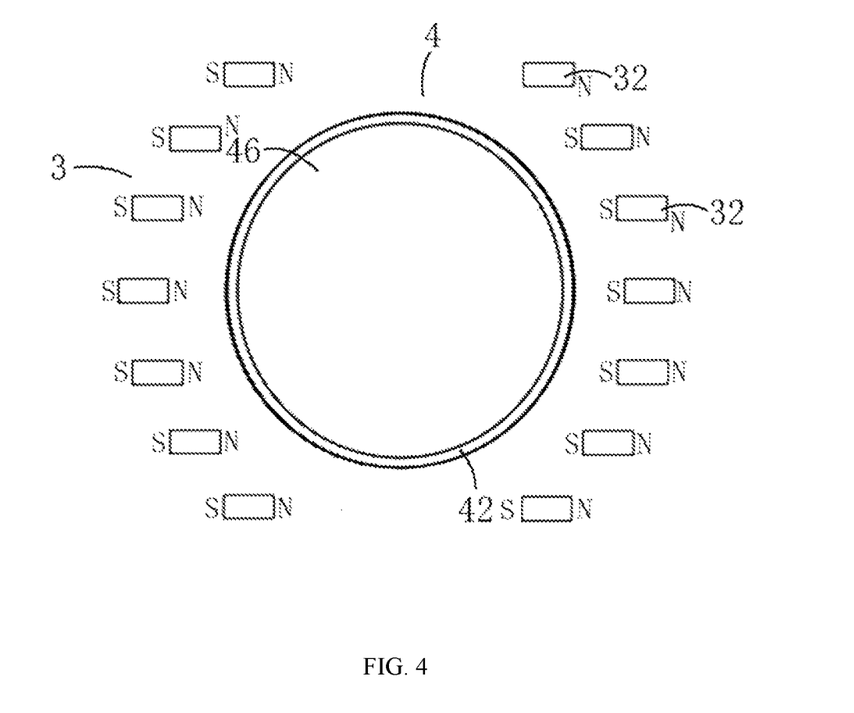
FIG. 4 illustrates a schematic top view of another magnetic conductive structure and another magnet structure according to some embodiments of the present disclosure.

In another embodiment of the present disclosure, as shown in FIG. 4, the magnetic conductive assembly further includes a magnetic conductive plate 46. The magnetic conductive plate 46 can be arranged parallel to and opposite to the carrier surface of the base 2, which can also guide the distribution of the magnetic field lines of the magnetic field above the base 2. Thus, the intensity of the magnetic field can be uniformly distributed above the base 2, and the directions of the magnetic field lines can be consistent. Meanwhile, with the above design, the difficulty of processing and manufacturing can be effectively reduced to effectively reduce the production and manufacturing costs. In embodiments of the present disclosure, a fixing ring 42 can be also provided. The structure and function of the fixing ring 42 can be the same as the structure and function of the fixing ring 42 in FIG. 2, which is not repeated here.

In an embodiment of the present disclosure, an outer surface of each magnet column 32 can be covered with an anti-corrosion layer made of a soft magnetic material (not shown in the figure). The anti-corrosion layer can be specifically made of soft magnetic material, such as stainless steel, silicon steel, or low-carbon steel. However, embodiments of the present disclosure are not limited to this. With the above design, the anti-corrosion layer can be used to greatly increase the strength of the magnet column 32 without affecting the magnetic property of the magnet column 32 to facilitate the assembly and maintenance of the magnet column 32. In addition, the anti-corrosion layer can be used to prevent the magnet column 32 from being corroded to greatly improve the service life of the magnet column 32.

To better understand the technical solutions of embodiments of the present disclosure, the principles and beneficial effects of the present disclosure are described below with reference to the accompanying drawings.

Figure 6:
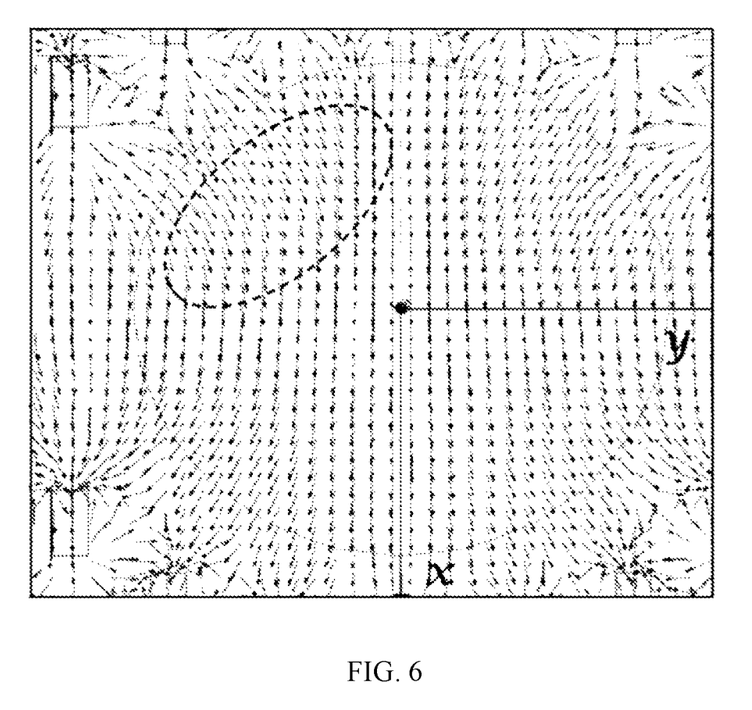
FIG. 6 illustrates a schematic diagram showing a simulation result of a magnetic field distribution in a process chamber in the existing technology.
Figure 7:
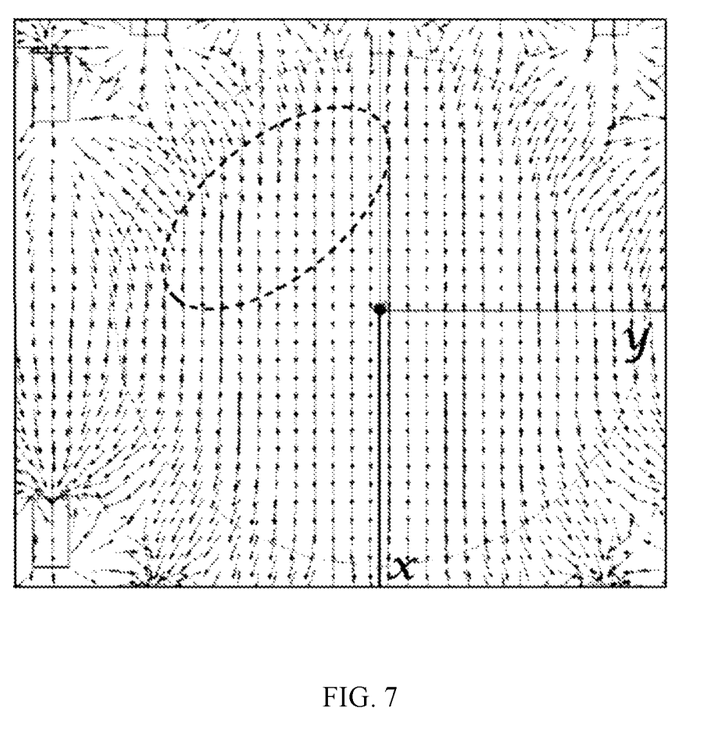
FIG. 7 illustrates a schematic diagram showing a simulation result of a magnetic field distribution in a process chamber according to some embodiments of the present disclosure.

By simulating the existing technology and embodiments of the present disclosure, FIG. 6 and FIG. 7 show specific simulation results. FIG. 6 shows a simulation result of the existing technology. FIG. 7 shows a simulation result of embodiments of the present disclosure. Specifically, FIG. 6 and FIG. 7 show the distributions of the magnetic fields at a distance of 2 mm above the upper surface of the wafer. The direction of the magnetic field of the area can be the direction indicated by the small arrow. Same areas are selected from FIG. 6 and FIG. 7, that is, areas within ellipse dotted lines in FIG. 6 and FIG. 7. By comparing the two areas, it can be clearly seen that compared with the existing technology, the intensity of the magnetic field is more evenly distributed near the top of the wafer in embodiments of the present disclosure, and the directions of the magnetic field lines are more consistent.

Figure 8:
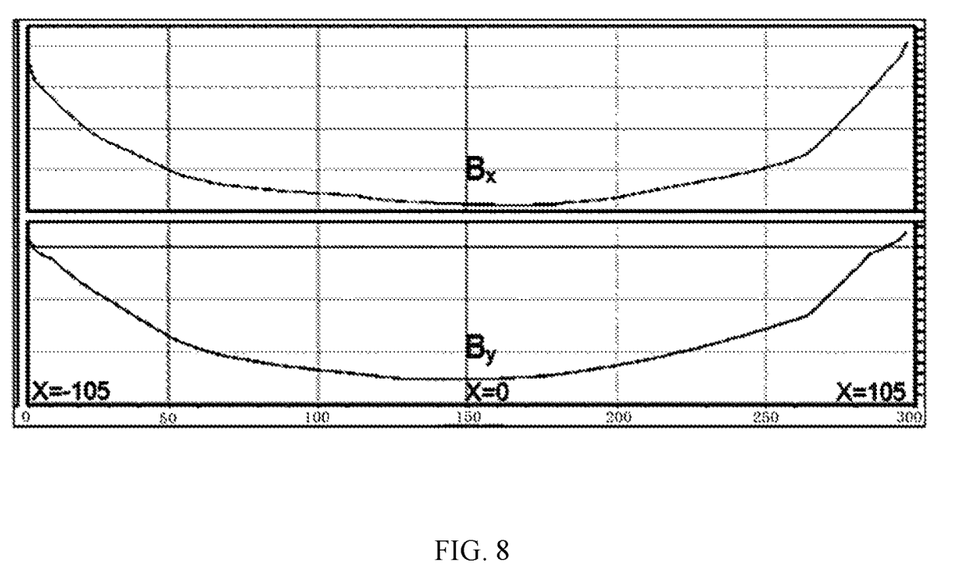
FIG. 8 illustrates a schematic diagram showing a change in a magnetic intensity component in the process chamber in the existing technology.
Figure 9:
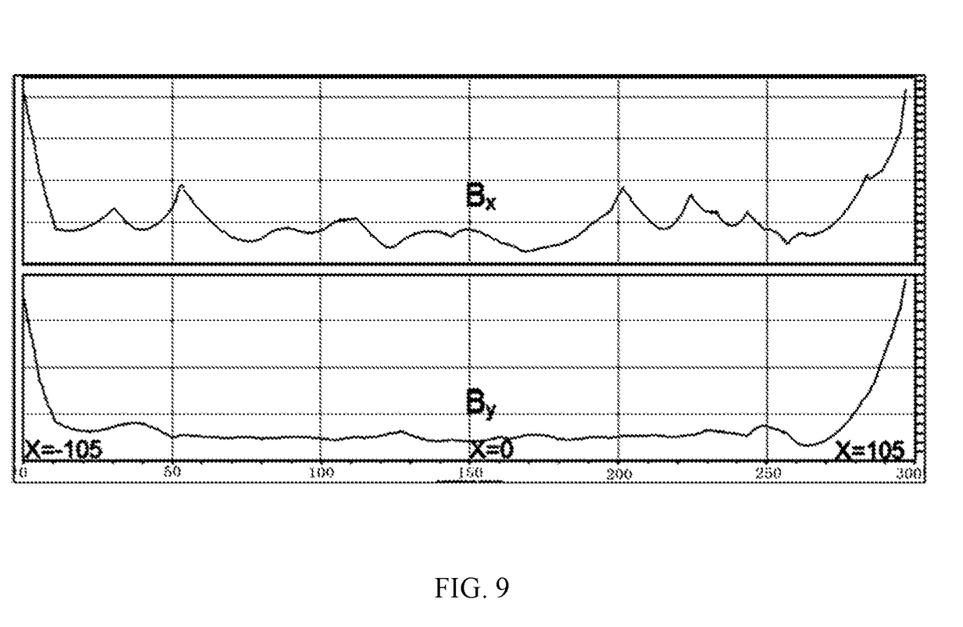
FIG. 9 illustrates a schematic diagram showing a change in a magnetic intensity component in the process chamber according to some embodiments of the present disclosure.

FIG. 8 and FIG. 9 show schematic diagrams showing changes in intensity components of the magnetic fields in the existing technology and embodiments of the present disclosure, respectively. As shown in FIG. 8 and FIG. 9, the intensity components of the magnetic fields at a distance of 2 mm above the upper surface of the wafer in direction x and direction y of FIG. 6 and FIG. 7 are component Bx and component By, respectively. Two curves of each of FIG. 6 and FIG. 7 are used to represent the changes of component Bx and component By along line y=x (x=−105 to x=105), respectively. The ordinate represents the intensity of the magnetic field, and the abscissa represents the distance. As shown in FIG. 8, in the existing technology, components Bx and By are both the weakest at the center of the wafer (x=0), and the strongest at the edge (x=+/−105), and increase from the center to the edge with a relatively wide variation range, which causes poor uniformity of the magnetic field distribution. As shown in FIG. 9, in embodiments of the present disclosure, regardless of component Bx or component By, component Bx and component By are substantially the same at the edge and the center at a distance of 2 mm from the upper surface of the wafer. Thus, the uniformity of the magnetic field distribution can be good.

Based on the same inventive concept, embodiments of the present disclosure provide a semiconductor process apparatus, including the process chamber of the semiconductor process apparatus of the above embodiments.

By applying embodiments of the present disclosure, at least the following beneficial effects can be achieved.

In embodiments of the present disclosure, the magnetic conductive structure can be arranged under the carrier surface of the base. The magnetic conductive structure can be configured to guide the distribution of the magnetic field lines of the magnetic field generated by the magnet structure above the base. That is, the magnetic conductive structure can have a magnetic yoke function to constrain the magnetic field lines. Thus, the intensity of the magnetic field above the base can be uniformly distributed, and the directions of the magnetic field lines at different positions of the corresponding carrier surface can be consistent. Thus, the hard and easy axes of the film at the positions of the wafer can be consistent to significantly improve the magnetic anisotropy of the film. The incident energy of the magnetic particles can be reduced, and the crystal defects caused by the high-energy magnetic particles in the film can be reduced. Thus, the internal stress of the film can be reduced, and the crystallization quality of the film can be improved. In addition, since the above magnetic conductive structure can significantly improve the magnetic anisotropy of the film, the buffer layer and the annealing process of the existing technology may not be needed to improve the magnetic anisotropy of the film, which can effectively reduce the crystal defects of the film to improve the film quality.

It can be understood that the above embodiments are only exemplary embodiments used to illustrate the principle of the present disclosure. However, the present disclosure is not limited to this. For those skilled in the art, without departing from the spirit and essence of the present disclosure, various modifications and improvements can be made, and these modifications and improvements can be also within the protection scope of the present disclosure.

In the description of the present disclosure, it should be understood that the orientation or positional relationship indicated by the terms "center," "upper," "lower," "front," "rear," "left," "right," "vertical," "horizontal," "top," "bottom," "inner," "outer," etc. is based on the orientation or positional relationship shown in the drawings. The terms are only used to facilitate description of the present disclosure and simplification of the description, rather than indicating or implying the devices or elements referred to must have a particular orientation, be constructed and operated in a particular orientation, which should not be construed as a limitation of the present disclosure.

The terms "first" and "second" are only used for description, and should not be construed as indicating or implying relative importance or implicitly indicating the number of technical features indicated. Thus, a feature defined as "first" or "second" may expressly or implicitly include one or more of the features. In the description of the present disclosure, unless otherwise specified, "a plurality of" means two or more.

In the description of the present disclosure, it should be noted that, unless otherwise expressly specified and limited, the terms "installed," "connected," and "coupled" should be understood in a broad sense. For example, the terms can mean a fixed connection or a detachable connection, an integral connection, a direct connection, an indirect connection through an intermediate medium, or internal communication of two elements. For those of ordinary skill in the art, the specific meanings of the above terms in the present disclosure can be understood according to specific situations.

What is claimed is:

1. A process chamber, comprising:
a chamber body; and
a base arranged in the chamber body and including a carrier surface configured to carry a wafer; and
a magnetic conductive device including:
a magnet structure arranged around the base and configured to provide a magnetic field near the base; and
a magnetic conductive structure arranged in the base with a preset distance from the carrier surface and from an arc shape to guide magnetic field lines of the magnetic field to be parallel with the carrier surface of the base to cause intensity of the magnetic field to be uniformly distributed above the base and directions of the magnetic field lines to be consistent at different positions of the carrier surface.

2. The process chamber according to claim 1, wherein the magnetic conductive structure includes a magnetic conductive assembly including:
a plurality of first magnetic conductive bars distributed evenly in a circular area that is parallel to and opposite to the carrier surface and extending along a first direction parallel to the carrier surface; or a plurality of second magnetic conductive bars distributed in the circular area, extending in different radial directions of the circular area, and symmetrically distributed about a center of the circular area, and a plurality of magnetic conductive rings arranged in the circular area along a radial direction of the circular area at a same interval and overlapping with the plurality of second magnetic conductive bars, centers of the plurality of magnetic conductive rings coinciding with the center of the circular area, and inner diameters of the plurality of magnetic conductive rings being different; or
a magnetic conductive plate arranged parallelly and oppositely to the carrier surface.

3. The process chamber according to claim 2, wherein a distance between any two neighboring first magnetic conductive bars of the plurality of first magnetic conductive bars is greater than or equal to 4 mm and smaller than or equal to 8 mm.

4. The process chamber according to claim 2, wherein a ratio of a diameter of the circular area to a diameter of the carrier surface is greater than or equal to two-thirds and smaller than or equal to one.

5. The process chamber according to claim 2, wherein the magnetic conductive structure further includes:
a fixing ring connected to the magnetic conductive assembly and configured to fix the magnetic conductive assembly in the base, an inner side of the fixing ring forming the circular area.

6. The process chamber according to claim 2, wherein the magnet structure includes:
two groups of magnet groups arranged on two sides of the base along a radial direction of the carrier surface, each group of the two groups of magnet groups including:
a plurality of magnet columns arranged in an arc shape along a circumference of the carrier surface at intervals, N poles and S poles of magnet columns of the two groups of magnet groups being arranged along a second direction at a same height, the second direction being parallel to a radial direction of the base and having a preset angle with the first direction, N poles of magnet columns of one group of magnet groups being close to the base, and S poles of magnet columns of the other group of magnet groups being close to the base; and
a fixing bracket configured to fix the two groups of magnet groups around the base.

7. The process chamber according to claim 6, wherein the preset angle is 90°.

8. The process chamber according to claim 6, wherein an outer surface of a magnet column of the plurality of magnet columns is covered with an anti-corrosion layer made of a soft magnetic material.

9. The process chamber according to claim 1, wherein:
a thickness of the magnetic conductive structure is greater than or equal to 2 mm and smaller than or equal to 10 mm; and
the preset distance is greater than or equal to 2 mm and smaller than or equal to 5 mm.

10. A semiconductor process apparatus comprising a process chamber including:
a chamber body; and
a base arranged in the chamber body and including a carrier surface configured to carry a wafer; and
a magnetic conductive device including:
a magnet structure arranged around the base and configured to provide a magnetic field near the base; and
a magnetic conductive structure arranged in the base with a preset distance from the carrier surface and from an arc shape to guide magnetic field lines of the magnetic field to be parallel with the carrier surface of the base to cause intensity of the magnetic field to be uniformly distributed above the base and directions of the magnetic field lines to be consistent at different positions of the carrier surface.

11. The semiconductor process apparatus according to claim 10, wherein the magnetic conductive structure includes a magnetic conductive assembly including:
a plurality of first magnetic conductive bars distributed evenly in a circular area that is parallel to and opposite to the carrier surface and extending along a first direction parallel to the carrier surface; or
a plurality of second magnetic conductive bars distributed in the circular area, extending in different radial directions of the circular area, and symmetrically distributed about a center of the circular area, and a plurality of magnetic conductive rings arranged in the circular area along a radial direction of the circular area at a same interval and overlapping with the plurality of second magnetic conductive bars, centers of the plurality of magnetic conductive rings coinciding with the center of the circular area, and inner diameters of the plurality of magnetic conductive rings being different; or
a magnetic conductive plate arranged parallelly and oppositely to the carrier surface.

12. The semiconductor process apparatus according to claim 11, wherein a distance between any two neighboring first magnetic conductive bars of the plurality of first magnetic conductive bars is greater than or equal to 4 mm and smaller than or equal to 8 mm.

13. The semiconductor process apparatus according to claim 11, wherein a ratio of a diameter of the circular area to a diameter of the carrier surface is greater than or equal to two-thirds and smaller than or equal to one.

14. The semiconductor process apparatus according to claim 11, wherein the magnetic conductive structure further includes:
a fixing ring connected to the magnetic conductive assembly and configured to fix the magnetic conductive assembly in the base, an inner side of the fixing ring forming the circular area.

15. The semiconductor process apparatus according to claim 11, wherein the magnet structure includes:
   two groups of magnet groups arranged on two sides of the base along a radial direction of the carrier surface, each group of the two groups of magnet groups including:
      a plurality of magnet columns arranged in an arc shape along a circumference of the carrier surface at intervals, N poles and S poles of magnet columns of the two groups of magnet groups being arranged along a second direction at a same height, the second direction being parallel to a radial direction of the base and having a preset angle with the first direction, N poles of magnet columns of one group of magnet groups being close to the base, and S poles of magnet columns of the other group of magnet groups being close to the base; and
   a fixing bracket configured to fix the two groups of magnet groups around the base.

16. The semiconductor process apparatus according to claim 15, wherein the preset angle is 90°.

17. The semiconductor process apparatus according to claim 15, wherein an outer surface of a magnet column of the plurality of magnet columns is covered with an anti-corrosion layer made of a soft magnetic material.

18. The semiconductor process apparatus according to claim 10, wherein:
   a thickness of the magnetic conductive structure is greater than or equal to 2 mm and smaller than or equal to 10 mm; and
   the preset distance is greater than or equal to 2 mm and smaller than or equal to 5 mm.

* * * * *